United States Patent
Komatsu et al.

(10) Patent No.: US 12,181,796 B2
(45) Date of Patent: Dec. 31, 2024

(54) WIRING FORMATION METHOD AND TRANSFER MOLD MANUFACTURING METHOD

(71) Applicant: CONNECTEC JAPAN Corporation, Myoko (JP)

(72) Inventors: Hiroshi Komatsu, Myoko (JP); Daisuke Sakai, Myoko (JP)

(73) Assignee: CONNECTEC JAPAN CORPORATION, Myoko (JP)

( * ) Notice: Subject to any disclaimer, the term of this patent is extended or adjusted under 35 U.S.C. 154(b) by 106 days.

(21) Appl. No.: 18/041,900

(22) PCT Filed: Jan. 8, 2021

(86) PCT No.: PCT/JP2021/000514
§ 371 (c)(1),
(2) Date: Feb. 16, 2023

(87) PCT Pub. No.: WO2022/064729
PCT Pub. Date: Mar. 31, 2022

(65) Prior Publication Data
US 2024/0032205 A1    Jan. 25, 2024

(30) Foreign Application Priority Data
Sep. 25, 2020 (JP) ................................ 2020-160867

(51) Int. Cl.
*G03F 7/00* (2006.01)
*H01L 21/48* (2006.01)
(Continued)

(52) U.S. Cl.
CPC ........... *G03F 7/0002* (2013.01); *H05K 3/107* (2013.01); *H05K 3/1275* (2013.01); *H01L 21/4867* (2013.01)

(58) Field of Classification Search
CPC .... G03F 7/0002; H05K 3/1275; H05K 3/207; H05K 2203/0113; H05K 3/107; H01L 21/4867
See application file for complete search history.

(56) References Cited

U.S. PATENT DOCUMENTS

2010/0206470 A1* 8/2010 Chen ..................... G03F 7/0002
                                                                    264/225
2016/0230005 A1* 8/2016 Mayumi ............... G03F 7/0002
(Continued)

FOREIGN PATENT DOCUMENTS

JP    2000-180862 A    6/2000
JP    2003-298214 A    10/2003
(Continued)

OTHER PUBLICATIONS

International Preliminary Report on Patentability dated Mar. 3, 2022 in International Application No. PCT/JP2021/000514.
(Continued)

*Primary Examiner* — Jerzi H Moreno Hernandez
(74) *Attorney, Agent, or Firm* — Sughrue Mion, PLLC

(57) ABSTRACT

Provided is an unprecedented and innovative wiring formation method with which it is possible to form transfer wiring using a transfer mold on a substrate having recesses and protrusions on the surface, without carrying out a smoothing process. The wiring formation method includes filling recesses (4a) arranged in a prescribed pattern in a transfer mold (4) having the recesses (4a) with an electroconductive member (2), laying the transfer mold (4) filled with the electroconductive member (2) over the surface of a substrate (1) having recesses and protrusions, transferring the electroconductive member (2) to the surface of the substrate (1), and forming a wiring part (3) on the surface of the substrate (1) using the electroconductive member (2), wherein a soft
(Continued)

mold having a durometer A hardness of 40-70 is used as the transfer mold (4).

14 Claims, 3 Drawing Sheets

(51) Int. Cl.
  *H05K 3/10* (2006.01)
  *H05K 3/12* (2006.01)

(56) References Cited

U.S. PATENT DOCUMENTS

2018/0226287 A1* 8/2018 Bower ................ H01L 33/0095
2023/0352341 A1* 11/2023 Komatsu ................ H05K 3/207

FOREIGN PATENT DOCUMENTS

| | | |
|---|---|---|
| JP | 2005-11877 A | 1/2005 |
| JP | 2006-302930 A | 11/2006 |
| JP | 2011-502194 A | 1/2011 |
| JP | 2015-182278 A | 10/2015 |
| JP | 2016-058664 A | 4/2016 |
| WO | 2015/056483 A1 | 4/2015 |
| WO | 2016/104723 A1 | 6/2016 |

OTHER PUBLICATIONS

Hiroshi Komatsu et al., "10 micron Pitch Wiring and Bump on Substrate Formed by Imprinting Technology to Apply Low Temperature Flip Chip Bonding", 16th International Conference and Exhibition on Device Packaging, Mar. 4, 2020, 9 page(s).
International Search Report for PCT/JP2021/000514 dated Mar. 23, 2021.
Extended European Search Report dated Sep. 2, 2024, issued in European Application No. 21871866.6.

* cited by examiner (a)

(b)

(c)

(a)

(b)

(c)

WIRING FORMATION METHOD AND TRANSFER MOLD MANUFACTURING METHOD

CROSS REFERENCE TO RELATED APPLICATIONS

This application is a National Stage of International Application No. PCT/JP2021/000514 filed Jan. 8, 2021, claiming priority based on Japanese Patent Application No. 2020-160867 filed Sep. 25, 2020.

TECHNICAL FIELD

The present invention relates to a wiring formation method in which wiring having a prescribed pattern is formed on a substrate, and in particular relates to a wiring formation method that is suitable for forming wiring on a substrate surface having recesses and protrusions.

BACKGROUND ART

When forming wiring in which an electroconductive paste is used, it is possible to carry out processes at lower temperatures than when wiring is formed using copper wiring, solder, or another material made of metal as in the prior art. It is therefore possible to form wiring and mount chips on a film made of plastic or the like, which was not previously possible.

In the prior art, wiring in which an electroconductive paste is used has ordinarily been formed using printing techniques. However, there is a limit to the minimum line width of wiring that can be formed through printing; for example, in typical screen printing, printing of wiring is limited to a width of about 30 μm. Additionally, a paste- or ink-form electroconductive member is used in printing, but is not immediately cured after being printed onto the substrate; therefore, when thick wiring (wiring having a high aspect ratio) is formed, dimensional accuracy decreases due to, inter alia, spreading of the wiring, and the wiring droops due to fluidity resulting from the fixed viscosity of the paste- or ink-form electroconductive member. Therefore, at present, the upper limit of the aspect ratio of wiring that can be formed through printing is about 0.5 at most.

However, in transfer wiring formation (imprinting) carried out using a transfer mold, wiring is miniaturized to a nano-level size, and an electroconductive paste is cured and transferred, therefore making it possible to form wiring having an aspect ratio equal to or greater than 1.

As pertains to the transfer wiring formation carried out using a transfer mold, the applicant proposed the method for manufacturing a substrate having an electroconductive part that is disclosed in Japanese Laid-open Patent Application No. 2016-58664 (this method being referred to below as a "prior-art example").

In the prior-art example: recesses in a mold having the recesses (expressed as a printing plate in Japanese Laid-open Patent Application No. 2016-58664) are filled with an electroconductive paste, the recesses being formed in a pattern that is the same as a wiring pattern to be formed on a substrate; and the mold in which the recesses are filled with the electroconductive paste is laid over and brought into pressure contact with the substrate, whereby the electroconductive paste filled into the recesses in the mold is transferred to the substrate, and wiring having a prescribed pattern is formed on the substrate.

However, in the prior-art example, a hard transfer mold referred to as a hard replica mold is used. Therefore, as shown in FIG. 2, for a substrate in which recesses and protrusions (differences in level) are present due to, inter alia, other wiring having already been formed on a wiring formation surface, a transfer mold 14 cannot suitably contact (come into close contact with) the surface of the substrate 11 due to the recesses and protrusions. This results in anomalies in which wiring 13 formed through the transfer does not come into close contact with the surface of the substrate 11, leaving the transfer-formed wiring 13 to remain above the surface without making close contact, particularly in the vicinity of the differences in level in the wiring formed in advance on the substrate 11.

PRIOR-ART LITERATURE

Patent Documents

[Patent Document 1] Japanese Laid-open Patent Application No. 2016-58664

DISCLOSURE OF THE INVENTION

Problems to be Solved by the Invention

Thus, prior-art wire forming presents problems in that wiring having a high aspect ratio cannot be formed through printing, and in that forming wiring using a transfer mold is not suitable for substrates having recesses and protrusions on the surface.

Therefore, when wiring having a high aspect ratio is to be formed on a substrate having recesses and protrusions on the surface, it is currently necessary to carry out a smoothing process on the substrate having the recesses and protrusions on the surface, and then to form the wiring using a transfer mold after the surface of the substrate is smoothed, presenting a problem in terms of an increase in effort and cost associated with the smoothing process.

The present invention was contrived in view of such circumstances, it being an object of the present invention to provide an unprecedented and innovative wiring formation method with which it is possible to form transfer wiring using a transfer mold on a substrate having recesses and protrusions on the surface, without carrying out a smoothing process.

Means for Solving the Problems

The main points of the present invention are described below with reference to the accompanying drawings.

A first aspect of the present invention relates to a wiring formation method in which recesses 4a arranged in a prescribed pattern in a transfer mold 4 having the recesses 4a are filled with an electroconductive member 2, the transfer mold 4 filled with the electroconductive member 2 is laid over the surface of a substrate 1 having recesses and protrusions, the electroconductive member 2 is transferred to the surface of the substrate 1, and a wiring part 3 is formed on the surface of the substrate 1 by using the electroconductive member 2, the wiring formation method being characterized by including a preparation step for preparing a soft transfer mold 4 having a durometer A hardness of 40-70, and a pressure contact step for laying the transfer mold 4 over the surface of the substrate 1, after which the transfer mold 4 deforms in accordance with the recesses and protrusions, and pressure contact is carried out such that the surface of the transfer mold 4 comes into close contact with the surface of the substrate 1.

A second aspect of the present invention relates to the wiring formation method according to the first aspect, characterized in that the recesses and protrusions are differences in level formed by wiring that is provided to the surface of the substrate 1, the wiring having an aspect ratio of 1 or greater, and in that, in the pressure contact step, the transfer mold 4 is laid over the surface of the substrate 1, after which the transfer mold 4 deforms in accordance with the recesses and protrusions, and pressure contact is carried out such that the surface of the transfer mold 4 comes into close contact with the surface of the substrate 1 and with the upper surface of the wiring.

A third aspect of the present invention relates to the wiring formation method according to the first aspect, characterized in that the transfer mold 4 is made of a resin material in which a curing agent is mixed with a main agent having a silicone polymer compound as a main component.

A fourth aspect of the present invention relates to the wiring formation method according to the second aspect, characterized in that the transfer mold 4 is made of a resin material in which a curing agent is mixed with a main agent having a silicone polymer compound as a main component.

A fifth aspect of the present invention relates to the wiring formation method according to the third aspect, characterized in that, in the resin material, the main agent and the curing agent are mixed in a mixing ratio of about 5:1.

A sixth aspect of the present invention relates to the wiring formation method according to the fourth aspect, characterized in that, in the resin material, the main agent and the curing agent are mixed in a mixing ratio of about 5:1.

A seventh aspect of the present invention relates to the wiring formation method according to any of the third to sixth aspects, characterized in that the transfer mold 4 is obtained by providing the resin material on an original plate on which protrusions arranged in a prescribed pattern are formed, subsequently press-molding the resin material using a support substrate, and carrying out a curing process.

An eighth aspect of the present invention relates to the wiring formation method according to the seventh aspect, characterized in that the curing process includes a normal-temperature curing process for curing at normal temperature, and a heating curing process for heating and curing at a temperature of 200° C. or greater.

A ninth aspect of the present invention relates to the wiring formation method according to the eighth aspect, characterized in that the normal-temperature curing process is carried out over the course of 24 hours or longer.

A tenth aspect of the present invention relates to the wiring formation method according to the eighth aspect, characterized in that the curing process includes carrying out the normal-temperature curing process over the course of 48 hours within a space set to 15-30° C., and then carrying out the heating curing process for 30 minutes at 200-250° C.

An eleventh aspect of the present invention relates to the wiring formation method according to the ninth aspect, characterized in that the curing process includes carrying out the normal-temperature curing process over the course of 48 hours within a space set to 15-30° C., and then carrying out the heating curing process for 30 minutes at 200-250° C.

Effects of the Invention

Due to being configured as described above, the present invention makes it possible to form transfer wiring using a transfer mold even on a substrate having recesses and protrusions on the surface.

Therefore, for example, when wiring having a high aspect ratio is to be formed on a substrate having recesses and protrusions on the surface, using the present invention obviates the need for a smoothing process that has been required when using a transfer mold in the past and yields effects for achieving a commensurate reduction in effort as well as improving throughput and reducing cost.

BEST MODE FOR CARRYING OUT THE INVENTION

Figure 1:
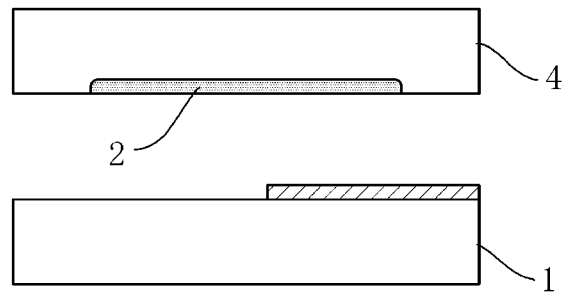
FIG. 1 is a schematic diagram showing wiring formation states when a transfer mold according to the present example is used.
Figure 1:
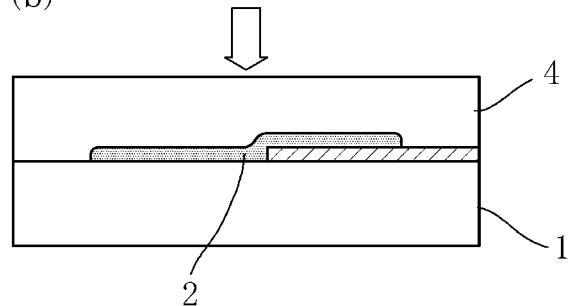
Figure 1:
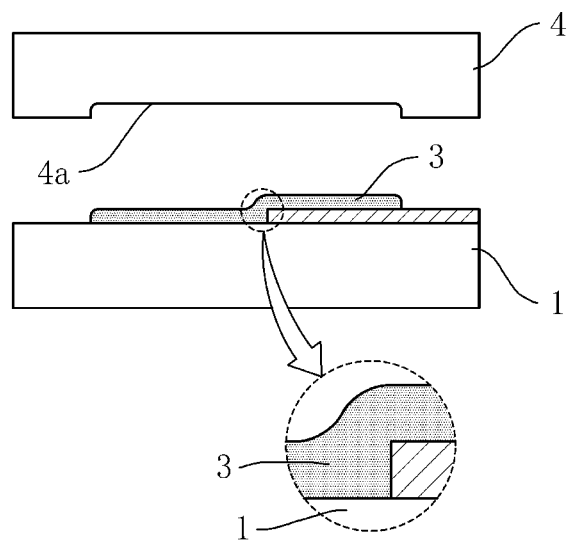
Figure 2:
FIG. 2 is a schematic diagram showing wiring formation states when a prior-art transfer mold is used.
Figure 2:
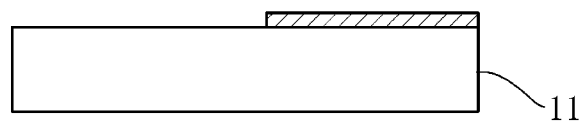
Figure 2:
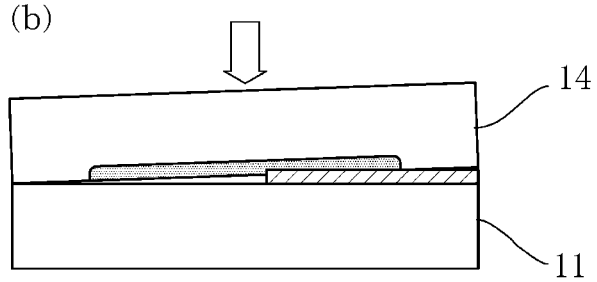
Figure 2:
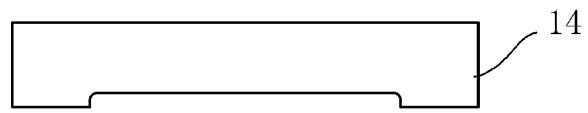
Figure 2:
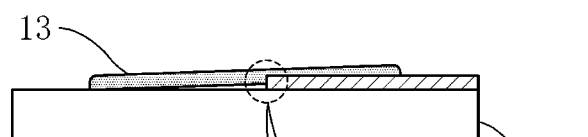
Figure 2:
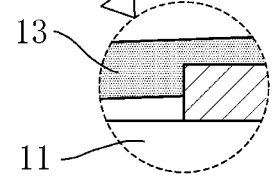

Preferred embodiments of the present invention are briefly described below with reference to the accompanying drawings while indicating the effects of the present invention.

Recesses 4a arranged in a prescribed pattern that are formed in a transfer mold 4 are filled with an electroconductive member 2, and the transfer mold 4 in which the recesses 4a are filled with the electroconductive member 2 is laid over and brought into contact under pressure with the surface of a substrate 1.

The transfer mold 4 deforms in accordance with recesses and protrusions in the substrate surface due to the pressure contact and reaches a state of being in close contact with the substrate surface.

This prevents anomalies in which a transfer-formed wiring part 3 remains above the surface of the substrate 1 (does not come into close contact with the substrate 1) even in the vicinity of differences in level in wiring formed in advance on the substrate 1, therefore making it possible to form transfer wiring using a transfer mold on the substrate having recesses and protrusions on the surface, even when no smoothing process is carried out.

Therefore, for example, when wiring having a high aspect ratio is to be formed on a substrate having recesses and protrusions on the surface, using the present invention obviates the need for a smoothing process that has been required when using a transfer mold in the past and yields effects for achieving a commensurate reduction in effort as well as improving throughput and reducing cost.

Examples

A specific example of the present invention is described below with reference to the accompanying drawings.

Examples

The present example is a wiring formation method in which recesses 4a arranged in a prescribed pattern in a transfer mold 4 having the recesses 4a are filled with an electroconductive member 2, the transfer mold 4 filled with the electroconductive member 2 is laid over the surface of a substrate 1 having recesses and protrusions, the electroconductive member 2 cured within the recesses 4a is transferred to the surface of the substrate 1, and a wiring part 3 is formed on the surface of the substrate 1 by using the electroconductive member 2. Specifically, the present example is a wiring formation method in which wiring is already formed on the substrate 1, and the wiring part 3 is formed by transfer, through an imprinting technique in which the transfer mold 4 is used, on the substrate 1 having recesses and protrusions (differences in level) on the surface due to the existing wiring.

First, the transfer mold 4 and the electroconductive member 2 that are used in the present example are described.

The transfer mold 4 according to the present example is a soft transfer mold 4 that is ordinarily referred to as a soft replica mold, the transfer mold 4 being obtained by adding a resin material dropwise onto an original plate (master mold) in which protrusions arranged in a prescribed pattern are formed, pressurizing and molding the resin material using a support substrate, and then carrying out a curing process.

Specifically, the transfer mold 4 according to the present example is made from a silicone resin formed by curing a resin material in which a main agent having a silicone polymer compound as a main component and a curing agent are mixed, the transfer mold 4 having a hardness of about 40-70 in terms of durometer A hardness.

The recesses 4a formed in the transfer mold 4 are formed in a tapered shape (forward tapered shape) such that the shape of the transfer-formed wiring part 3 on the substrate 1 is forwardly tapered.

More specifically, the transfer mold 4 according to the present example is manufactured as described below.

A resin material in which polydimethylsiloxane (PDMS), which serves as a main agent, and a curing agent are mixed in a ratio of 5:1 is added dropwise onto an original plate on which protrusions arranged in a prescribed pattern are formed. The resin material is pressure-molded using a support substrate.

In the prior art, the mixing ratio of a main agent and a curing agent in resin materials having PDMS as a main agent is set to about 10:1, but in the present example, the proportion of curing agent is increased (approximately doubled) as indicated above. This proportion is increased in order to reduce the stickiness (tackiness) of the surface of the transfer mold 4 after curing and facilitate scraping away of the electroconductive member 2 on the surface of the transfer mold 4.

The pressure-molded resin material is next subjected to a normal-temperature curing process for curing the resin material at normal temperature (15-30° C., preferably 25° C.) over the course of 24 hours or longer, preferably 48 hours or longer. The conditions for the normal-temperature curing process in the present example are set to 25° C. and 48 hours.

The transfer mold 4 that has undergone the normal-temperature curing process is then detached from the original plate, and the detached transfer mold 4 is subjected to a heating curing process at 200-300° C., preferably 250° C., for about 30 minutes using a heating device (e.g., a hot plate or the like) to carry out final curing of the resin material and complete the transfer mold 4.

The transfer mold 4 formed through the above-described manufacturing method has a durometer A hardness of about 60.

As regards resin materials having PDMS as a main agent, in the prior art, the resin material added dropwise onto the original plate is press-molded using a support substrate, after which the resin material is subjected to a heating curing process at 100-150° C. for about 10-35 minutes, and a transfer mold is cured to a prescribed hardness through the heating curing process. However, in this prior-art heating curing process, pattern shrinkage exceeding 2% can occur even in a heating curing process at the lower-limit temperature of 100° C. due to a difference in thermal expansion coefficient between the transfer mold and the original plate (main material, glass). By contrast, in the present example, the curing process is configured as a two-stage process including the normal-temperature curing process and the heating curing process, as described above, thereby making it possible to keep pattern shrinkage within around 0.5%.

Specifically, in the present example, the pattern shrinkage after the normal-temperature curing process at 25° C. for 48 hours is about 0.1%, and the pattern shrinkage after the heating curing process at 250° C. for 30 minutes is about 0.6%.

The electroconductive member 2 used in the present example is an active-light-ray-curable-resin-containing electroconductive paste in which an active-light-ray-curable resin is contained in an electroconductive paste.

Specifically, in the wiring formation method according to the present example, the electroconductive member 2 is not cured through heating, but rather is cured by using, e.g., ultraviolet rays or other active light rays.

More specifically, the electroconductive paste can be selected from Ag pastes (including nanopastes), Cu pastes (including nanopastes), Au pastes (including nanopastes), Pt pastes (including nanopastes), Pd pastes (including nanopastes), Ru pastes (including nanopastes), and C pastes (including nanopastes). In the present example, an Ag paste is used.

An electroconductive paste in which the average particle diameter is set to 1/5-1/10 of the minimum line width of the wiring part 3 formed on the substrate 1 is used in the present example. Specifically, for example, when forming a wiring pattern for which the minimum ratio of lines and spaces (L/S) is 5 μm/5 μm, an electroconductive paste in which the average particle diameter is 0.5-1.0 μm is used.

The active-light-ray-curable resin contained in the electroconductive paste is an ultraviolet-ray-curable resin and is contained in the electroconductive paste such that the volume proportion thereof in the electroconductive member reaches 20-40%.

Specifically, the electroconductive member 2 according to the present example is an ultraviolet-ray-curable-resin-containing Ag paste in which the volume ratio of the Ag paste and the ultraviolet-ray-curable resin is set to 6:4-8:2.

The specific wiring formation method according to the present example is described below.

In the wiring formation method according to the present example, as described above, the recesses 4a arranged in the prescribed pattern in the transfer mold 4 having the recesses 4a are filled with the electroconductive member 2, the transfer mold 4 filled with the electroconductive member 2 is laid over the surface of the substrate 1 having recesses and protrusions, the electroconductive member 2 within the recesses 4a is transferred to the surface of the substrate 1, and the wiring part 3 is formed on the surface of the substrate 1 by using the electroconductive paste 2.

Figure 3:
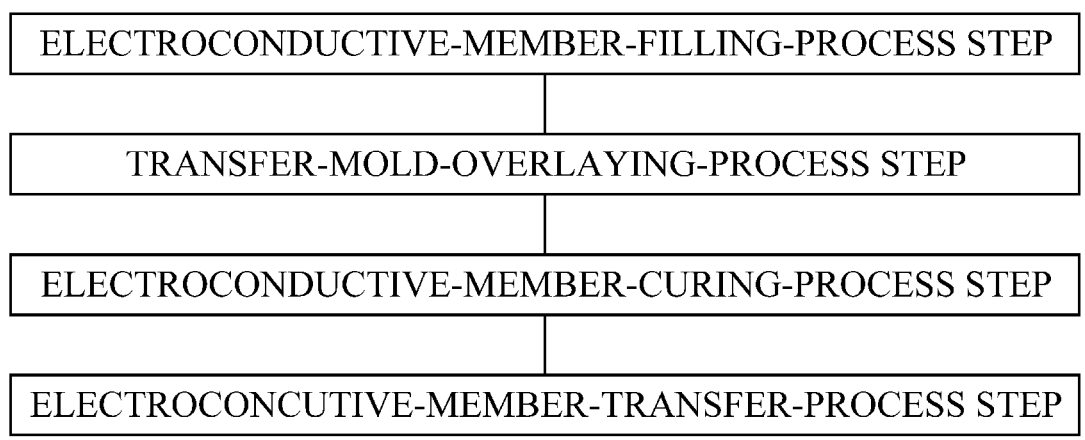
FIG. 3 is a flow chart showing process steps in the present example.

Specifically, in the present example, as shown in FIG. 3, the wiring formation method has an electroconductive-member-filling-process step for filling the recesses 4a in the transfer mold 4 with the electroconductive member 2, a transfer-mold-overlaying-process step for laying the transfer mold 4 filled with the electroconductive member 2 over the substrate 1, an electroconductive-member-curing-process step for curing the electroconductive member 2 filling the recesses 4a in the transfer mold 4, and an electroconductivemember-transfer-process step for transferring the electroconductive member 2 cured within the recesses 4a in the transfer mold 4 to the substrate 1 and forming the wiring part 3 in the prescribed pattern on the substrate 1, these processes being carried out in the stated order.

The process steps according to the present example are described below.

In the electroconductive-member-filling-process step, the transfer mold 4 is placed such that the openings of the recesses 4a are oriented upward, and the recesses 4a are filled with the electroconductive member 2 from above, after which any electroconductive member 2 overflowing from the recesses 4a or the surface of the transfer mold 4 is scraped away and removed using a scraper (squeegee), and only the recesses 4a are filled with the electroconductive member 2.

As described above, in the transfer mold 4 used in the present example, the mixing ratio of the curing agent relative to the main agent is made greater than in the prior art and the stickiness (tackiness) of the surface of the transfer mold 4 is reduced. Therefore, in the electroconductive-member-filling-process step, it is possible to smoothly scrape away and remove unnecessary electroconductive member 2 on the surface of the transfer mold 4, and the unnecessary electroconductive member 2 is prevented from remaining on the surface of the transfer mold 4 to the greatest extent possible.

In the transfer-mold-overlaying-process step, the transfer mold 4 in which the recesses 4a are filled with the electroconductive member 2 is laid over the substrate 1 and is brought into contact under pressure with the substrate 1 through application of pressure.

In the present example, a soft transfer mold 4 (soft replica mold) having a durometer A hardness of 60 is used as the transfer mold 4. Therefore, as shown in FIG. 1, when the transfer mold 4 is brought into contact under pressure with the substrate 1, the transfer mold 4 elastically deforms following accordance with recesses and protrusions in the substrate 1; i.e., differences in level that are formed by wiring that is already formed on the substrate 1, and the surface of the transfer mold 4 (on the side with the openings of the recesses 4a) reaches a state of contacting (being in close contact with) the surface of the substrate 1 and the wiring surface that is already formed on the substrate 1.

In the electroconductive-member-curing-process step, the electroconductive member 2 filling the recesses 4a in the transfer mold 4 is cured. In the present example, the electroconductive member 2 is cured using ultraviolet radiation.

Specifically, the recesses 4a in the transfer mold 4 are irradiated with the ultraviolet radiation from the bottom side, the portion of the electroconductive member 2 filling the recesses 4a in the transfer mold 4 that forms a contact interface with the inner surfaces of the recesses 4a is cured, and release properties of the electroconductive member 2 with respect to the transfer mold 4 are improved.

As indicated in the present example, curing the electroconductive member 2 using ultraviolet radiation greatly shortens the process time over a case when an electroconductive member is cured through heating.

The electroconductive-member curing step can be carried out before the transfer mold 4 is laid over the substrate 1, i.e., before the transfer-mold-overlaying-process step.

In the electroconductive-member-transfer-process step, the transfer mold 4 laid over the substrate 1 is separated from the substrate 1, the electroconductive member 2 within the recesses 4a in the transfer mold 4 is transferred to the substrate 1, and the wiring part 3 having the prescribed pattern is formed on the substrate 1.

The effects of the present example are described below.

In the present example, because a soft transfer mold 4 (soft replica mold) having a durometer A hardness of 60 is used as the transfer mold 4, it is possible to form transfer wiring (form wiring through imprinting) using a transfer mold on a substrate having recesses and protrusions on the surface even when no smoothing process is carried out.

For example, when forming wiring having a high aspect ratio (wiring having a high wiring height relative to wiring width and having large differences in level) on a substrate having recesses and protrusions on the surface, it has heretofore been necessary to carry out a smoothing process, but the present example obviates the need for the smoothing process and yields effects for achieving a commensurate reduction in effort as well as improving throughput and reducing cost.

Additionally, because the surface of the transfer mold 4 used in the present example has lower stickiness (tackiness) than in prior-art transfer molds, the operability of a process for scraping away the electroconductive member 2 using a scraper (squeegee) improves.

Moreover, because the transfer mold 4 used in the present example is cured using the two-stage curing process including the normal-temperature curing process and the heating curing process, pattern shrinkage can be kept within around 0.5%.

In the present example, because an ultraviolet-ray-curable-resin-containing Ag paste in which an ultraviolet-ray-curable resin is incorporated into an Ag paste is used as the electroconductive member 2, and because the electroconductive member 2 is cured using ultraviolet radiation, pattern deformation is reduced, generation of stress is suppressed, complete transfer is enabled, and furthermore curing time is greatly reduced and throughput improves to a greater extent than when a heat-curable-resin-containing electroconductive paste is used and is cured through a heating process.

Additionally, in the present example, due to using the electroconductive member 2 in which is used an Ag paste having an average particle diameter set to $\frac{1}{5}$-$\frac{1}{10}$ of the minimum line width of the wiring part 3, the wiring part 3 formed on the substrate 1 attains a smooth shape having few recesses and protrusions, whereby the concentration of localized electrical fields within the wiring part 3 is mitigated and the reliability of the wiring part 3 over time improves.

Moreover, in the present example, because the recesses 4a in the transfer mold 4 are formed in a tapered shape (forward tapered shape), the shape of the transfer-formed wiring part 3 on the substrate 1 is forwardly tapered, the release properties of the electroconductive member 2 during transfer from the recesses 4a in the transfer mold 4 improve, the electroconductive member 2 is smoothly released, and the yield in the electroconductive-member-transfer-process step improves.

Thus, the present example provides an unprecedented and innovative wiring formation method that exhibits the innovative effects described above.

The present invention is not limited to the present example; the specific configuration of configuration conditions in the present invention can be designed as appropriate.

The invention claimed is:

1. A wiring formation method in which recesses arranged in a prescribed pattern in a transfer mold are filled with an electroconductive member, the transfer mold filled with the electroconductive member is laid over a surface of a substrate having recesses and protrusions, the electroconductive member is transferred to the surface of the substrate, and a wiring part is formed on the surface of the substrate by using the electroconductive member, the wiring formation method being characterized by including a preparation step for preparing a soft transfer mold having a durometer A hardness of 40-70 as the transfer mold, and a pressure contact step for laying the transfer mold over the surface of the substrate, after which the transfer mold deforms in accordance with the recesses and protrusions, and pressure contact is carried out such that a surface of the transfer mold comes into close contact with the surface of the substrate.

2. The wiring formation method according to claim 1, characterized in that the recesses and protrusions in the substrate are differences in level formed by wiring that is previously provided to the surface of the substrate, the wiring having an aspect ratio of 1 or greater, and further characterized in that the pressure contact is carried out such that the surface of the transfer mold comes into close contact with the surface of the substrate and with an upper surface of the wiring.

3. The wiring formation method according to claim 1, characterized in that the transfer mold is made of a resin material in which a curing agent is mixed with a main agent having a silicone polymer compound as a main component.

4. The wiring formation method according to claim 2, characterized in that the transfer mold is made of a resin material in which a curing agent is mixed with a main agent having a silicone polymer compound as a main component.

5. The wiring formation method according to claim 3, characterized in that, in the resin material, the main agent and the curing agent are mixed in a mixing ratio of about 5:1.

6. The wiring formation method according to claim 4, characterized in that, in the resin material, the main agent and the curing agent are mixed in a mixing ratio of about 5:1.

7. The wiring formation method according to claim 3, characterized in that the transfer mold is obtained by providing the resin material on an original plate on which protrusions arranged in a prescribed pattern are formed, subsequently press-molding the resin material using a support substrate, and carrying out a curing process.

8. The wiring formation method according to claim 7, characterized in that the curing process includes a normal-temperature curing process for curing at normal temperature, and a heating curing process for heating and curing at a temperature of 200° C. or greater.

9. The wiring formation method according to claim 8, characterized in that the normal-temperature curing process is carried out over the course of 24 hours or longer.

10. The wiring formation method according to claim 8, characterized in that the curing process includes carrying out the normal-temperature curing process over the course of 48 hours within a space set to 15-30° C., and then carrying out the heating curing process for 30 minutes at 200-250° C.

11. The wiring formation method according to claim 9, characterized in that the curing process includes carrying out the normal-temperature curing process over the course of 48 hours within a space set to 15-30° C., and then carrying out the heating curing process for 30 minutes at 200-250° C.

12. The wiring formation method according to claim 4, characterized in that the transfer mold is obtained by providing the resin material on an original plate on which protrusions arranged in a prescribed pattern are formed, subsequently press-molding the resin material using a support substrate, and carrying out a curing process.

13. The wiring formation method according to claim 5, characterized in that the transfer mold is obtained by providing the resin material on an original plate on which protrusions arranged in a prescribed pattern are formed, subsequently press-molding the resin material using a support substrate, and carrying out a curing process.

14. The wiring formation method according to claim 6, characterized in that the transfer mold is obtained by providing the resin material on an original plate on which protrusions arranged in a prescribed pattern are formed, subsequently press-molding the resin material using a support substrate, and carrying out a curing process.

* * * * *